US009788434B2

(12) United States Patent
Jeong et al.

(10) Patent No.: US 9,788,434 B2
(45) Date of Patent: Oct. 10, 2017

(54) PREPARATION METHOD FOR DRY FILM SOLDER RESIST AND FILM LAMINATE USED THEREIN

(71) Applicant: LG CHEM, LTD., Seoul (KR)

(72) Inventors: Min Su Jeong, Daejeon (KR); You Jin Kyung, Daejeon (KR); Byung Ju Choi, Daejeon (KR); Woo Jae Jeong, Daejeon (KR); Bo Yun Choi, Daejeon (KR); Kwang Joo Lee, Daejeon (KR); Se Jin Ku, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/763,414

(22) PCT Filed: Sep. 22, 2014

(86) PCT No.: PCT/KR2014/008791
§ 371 (c)(1),
(2) Date: Jul. 24, 2015

(87) PCT Pub. No.: WO2015/046842
PCT Pub. Date: Apr. 2, 2015

(65) Prior Publication Data
US 2015/0366070 A1    Dec. 17, 2015

(30) Foreign Application Priority Data

Sep. 24, 2013  (KR) .................. 10-2013-0113179

(51) Int. Cl.

| G03F 7/11 | (2006.01) |
| G06F 7/40 | (2006.01) |
| H05K 3/02 | (2006.01) |
| H05K 3/28 | (2006.01) |
| G03F 7/038 | (2006.01) |
| G03F 7/16 | (2006.01) |
| G03F 7/20 | (2006.01) |
| G03F 7/32 | (2006.01) |
| G03F 7/40 | (2006.01) |
| H01L 21/48 | (2006.01) |
| G03F 7/027 | (2006.01) |
| G03F 7/09 | (2006.01) |
| H05K 3/34 | (2006.01) |

(52) U.S. Cl.
CPC ............ *H05K 3/027* (2013.01); *G03F 7/027* (2013.01); *G03F 7/038* (2013.01); *G03F 7/09* (2013.01); *G03F 7/16* (2013.01); *G03F 7/20* (2013.01); *G03F 7/327* (2013.01); *G03F 7/40* (2013.01); *H01L 21/4846* (2013.01); *H05K 3/281* (2013.01); *H05K 3/3452* (2013.01)

(58) Field of Classification Search
CPC ............ G03F 7/11; G03F 7/09; G03F 7/092
USPC ........................................ 430/271.1, 273.1
See application file for complete search history.

(56) References Cited

U.S. PATENT DOCUMENTS

| 5,648,159 A * | 7/1997 | Sato .................. B32B 27/36 428/323 |
| 2007/0096327 A1 * | 5/2007 | Kawamura .......... H01L 21/4853 257/774 |
| 2009/0136878 A1 | 5/2009 | Kanna |
| 2009/0286087 A1 | 11/2009 | Tanaka et al. |
| 2011/0269866 A1 | 11/2011 | Jeong et al. |

FOREIGN PATENT DOCUMENTS

| JP | 2002-185132 A | 6/2002 |
| JP | 2004-004263 A | 1/2004 |
| JP | 2005-292581 A | 10/2005 |
| JP | 2006-220886 A | 8/2006 |
| JP | 2007-178500 A | 7/2007 |
| JP | 2008-176278 A | 7/2008 |
| JP | 2009-223142 A | 10/2009 |
| JP | 2012-027368 A | 2/2012 |
| KR | 10-0237255 B1 | 1/2000 |
| KR | 10-0317078 B1 | 6/2002 |
| KR | 10-2004-0070067 A | 8/2004 |
| KR | 10-2011-0106237 A | 9/2011 |
| KR | 10-2013-0095683 A | 8/2013 |
| KR | 10-2014-0018117 A | 2/2014 |
| WO | 2006/059345 A2 | 6/2006 |
| WO | 2007/004657 A1 | 1/2007 |

OTHER PUBLICATIONS

AN 2002:486633, ACS on STN database, file CAPLUS, English abstract of JP 2002185132 A, Kamayachi et al, generated from SciFinder database on Jan. 22, 2017, three pages.*
English translation of JP, 2002-185132, A (2002) from machine translation from AIPN Japan Patent Office National Center for Industrial Property Information and Training, generated Jan. 21, 2017, 11 pages.*
English translation of JP, 2006-220886, A (2006) from machine translation from AIPN Japan Patent Office National Center for Industrial Property Information and Training, generated Jan. 21, 2017, 26 pages.*
International Search Report issued in corresponding application No. PCT/KR2014/008791 dated Dec. 12, 2014, 2 pages.

\* cited by examiner

*Primary Examiner* — Cynthia Hamilton
(74) *Attorney, Agent, or Firm* — Rothwell, Figg, Ernst & Manbeck, P.C.

(57) ABSTRACT

The present invention relates to a preparation method for a dry film solder resist (DFSR) capable of forming the DFSR having fine unevenness on a surface by a more simplified method, and a film laminate used therein. The preparation method for a dry film solder resist includes forming a predetermined photo-curable and heat-curable resin composition on a transparent carrier film having a surface on which a fine unevenness having an average roughness (Ra) of 200 nm to 2 μm is formed; laminating the resin composition on a substrate to form a laminated structure in which the substrate, the resin composition, and the transparent carrier film are sequentially formed; exposing the resin composition and delaminating the transparent carrier film; and alkaline-developing the resin composition in a non-exposure part and performing heat-curing.

16 Claims, 6 Drawing Sheets

[FIG. 1a]
[FIG. 1b]
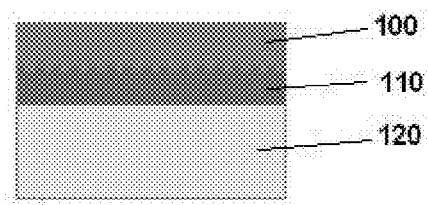
[FIG. 1c]
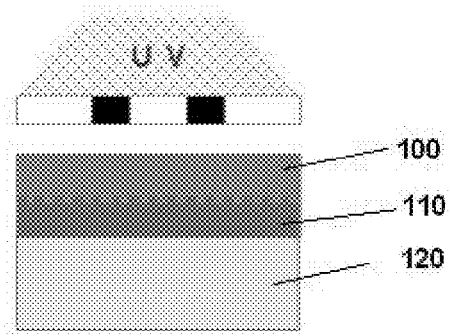
[FIG. 1d]
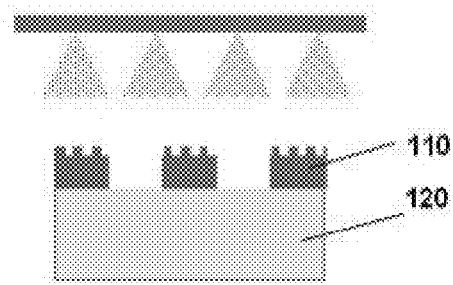

[FIG. 1e]
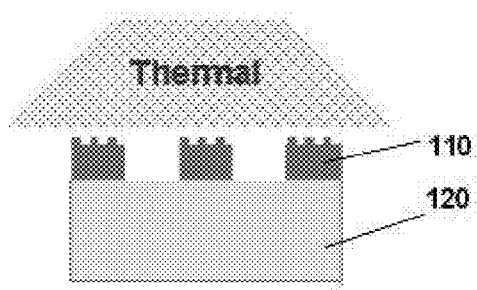
[FIG. 2]
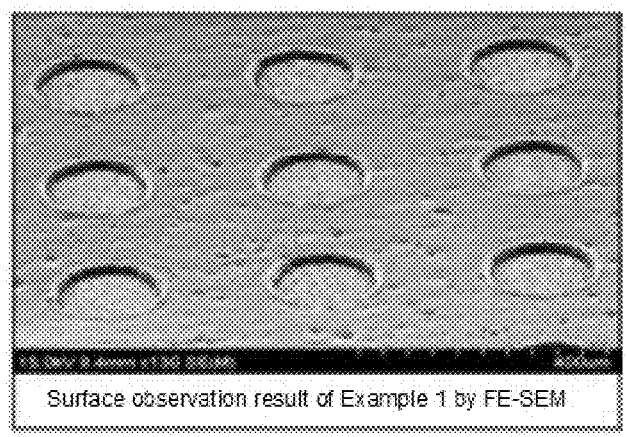
Surface observation result of Example 1 by FE-SEM
[FIG. 3]
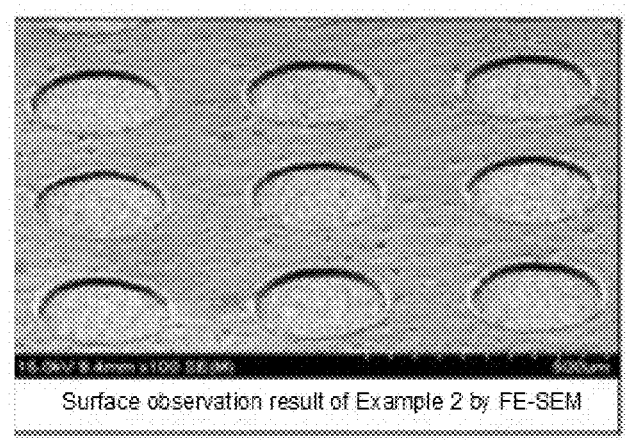
Surface observation result of Example 2 by FE-SEM

[FIG. 4a]
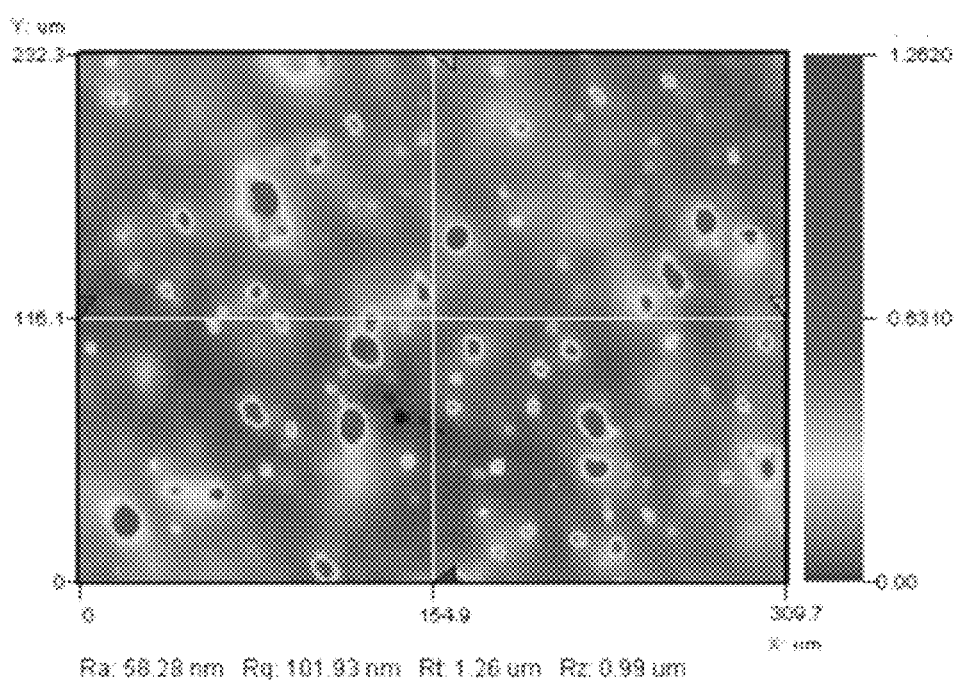

[FIG. 4b]
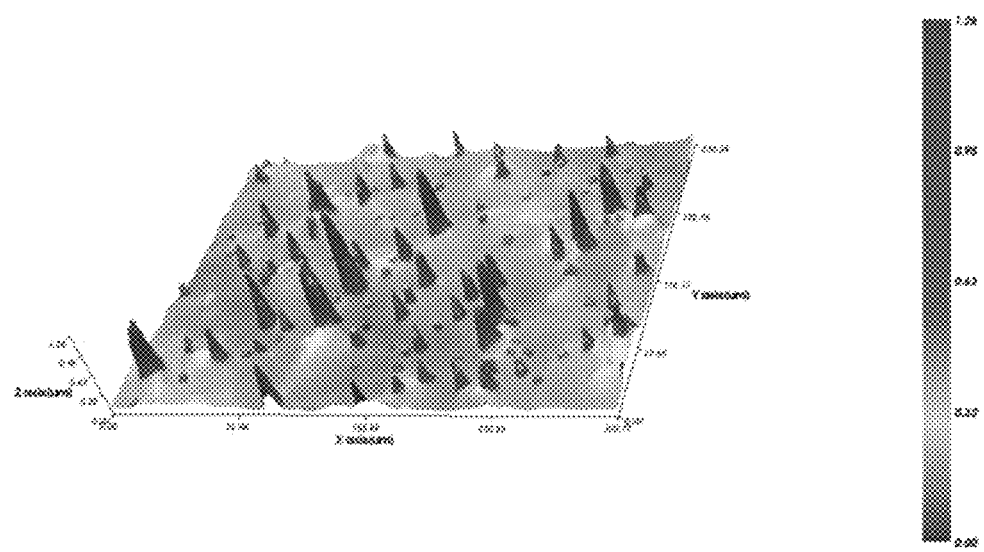

[FIG. 5a]
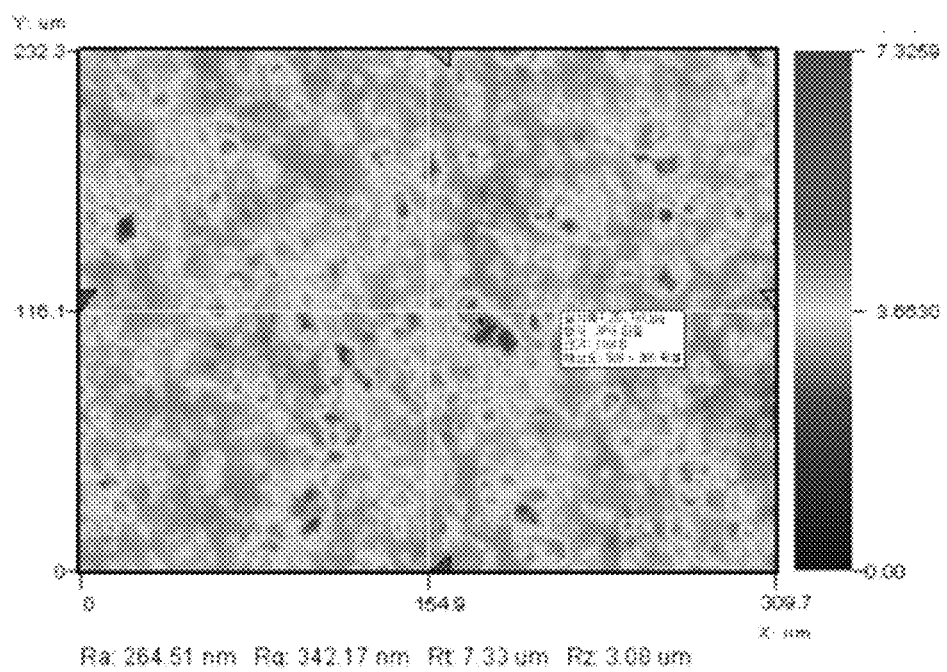

[FIG. 5b]
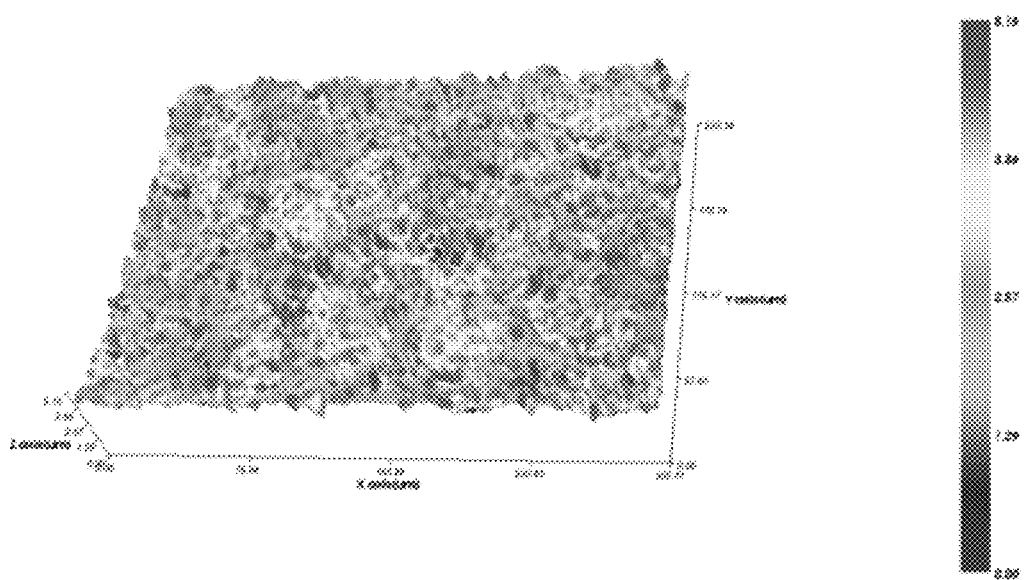

PREPARATION METHOD FOR DRY FILM SOLDER RESIST AND FILM LAMINATE USED THEREIN

CROSS REFERENCE TO RELATED APPLICATIONS

This application is a 35 U.S.C. §371 National Phase Entry Application from PCT/KR2014/008791, filed Sep. 22, 2014, and designating the United States, which claims priority under 35 U.S.C. §119 to Korean Patent Application No., 10-2013-0113179 filed Sep. 24, 2013.

TECHNICAL FIELD

The present invention relates to a preparation method for a dry film solder resist (DFSR) capable of forming the DFSR having fine unevenness on a surface by a more simplified method, and a film laminate used therein.

BACKGROUND ART

As various electronic equipments have small size and light weight, a photosensitive solder resist capable of forming a fine opening pattern is used in a printed circuit board, a semiconductor package substrate, a flexible circuit substrate, and the like.

In general, the solder resist is required to have properties such as a development property, a high resolution property, an insulation property, solder heat resistance, gold plating resistance, and the like. In addition, when applying the solder resist to the semiconductor package substrate, and the like, in order to assure easiness of processes such as the securing of excellent adhesion with materials for subsequent processes or the securing of releasing property with an epoxy molding compound (EMC) mold, and the like, in performing the processes, a fine surface unevenness is formed on a film type solder resist as needed.

Meanwhile, according to the related art, in order to form the fine surface unevenness, the film type solder resist, for example, a DFSR is formed by a photo-curing process, a heat-curing process, and the like, and then, separate surface treatment processes such as a plasma treatment process, and the like, are performed, or a composition itself for forming the DFSR is changed. However, since the addition of the separate treatment processes such as the plasma treatment process, and the like, or the change of the composition is involved, there are disadvantages in that the entire processes are complicated and are not economical.

SUMMARY OF INVENTION

Technical Problem

The present invention provides a preparation method for a dry film solder resist (DFSR) capable of forming the DFSR having fine unevenness on a surface by a more simplified method without adding separate processes or changing a composition.

In addition, the present invention provides a film laminate used as an intermediate, and the like, in the preparation method for DFSR.

Solution to Problem

An exemplary embodiment of the present invention provides a preparation method for a dry film solder resist (DFSR), including: forming a photo-curable and heat-curable resin composition on a transparent carrier film having a surface on which a fine unevenness having an average roughness (Ra) of 50 nm to 5 µm is formed, the resin composition including (a) an acid-modified oligomer having a carboxyl group (—COOH) and a photo-curable unsaturated functional group, (b) a photopolymerizable monomer having two or more photo-curable unsaturated functional groups, (c) a heat-curable binder having a heat-curable functional group, and (d) a photoinitiator; laminating the resin composition on a substrate to form a laminated structure in which the substrate, the resin composition, and the transparent carrier film are sequentially formed; exposing the resin composition and delaminating the transparent carrier film; and alkaline-developing the resin composition in a non-exposure part and performing heat-curing.

An exemplary embodiment of the present invention provides a film laminate for forming a dry film solder resist (DFSR), including: a transparent carrier film having a surface on which a fine unevenness having an average roughness (Ra) of 50 nm to 5 µm is formed, and a resin composition layer including (a) an acid-modified oligomer having a carboxyl group (—COOH) and a photo-curable unsaturated functional group, (b) a photopolymerizable monomer having two or more photo-curable unsaturated functional groups, (c) a heat-curable binder having a heat-curable functional group, and (d) a photoinitiator, formed on the film; wherein the resin composition layer has a gelation time of 2 to 5 minutes under condition of 0.4 g and 160.

Hereinafter, a preparation method for DFSR according to an exemplary embodiment of the present invention and a film laminate for a dry film solder resist (DFSR) used therein will be described in more detail.

According to an exemplary embodiment of the present invention, there is provided a preparation method for a dry film solder resist (DFSR) including: forming a photo-curable and heat-curable resin composition on a transparent carrier film having a surface on which a fine unevenness having an average roughness (Ra) of 50 nm to 5 µm is formed, the resin composition including (a) an acid-modified oligomer having a carboxyl group (—COOH) and a photo-curable unsaturated functional group, (b) a photopolymerizable monomer having two or more photo-curable unsaturated functional groups, (c) a heat-curable binder having a heat-curable functional group, and (d) a photoinitiator; laminating the resin composition on a substrate to form a laminated structure in which the substrate, the resin composition, and the transparent carrier film are sequentially formed; exposing the resin composition and delaminating the transparent carrier film; and alkaline-developing the resin composition in a non-exposure part and performing heat-curing.

In the preparation method, after general photo-curable and heat-curable resin composition for forming DFSR is formed on the transparent carrier film having a surface in which a fine unevenness is formed, and subsequent preparation processes of DFSR are performed, such that the fine unevenness on the transparent carrier film is reflected on the DFSR, thereby finally preparing the DFSR having the fine unevenness favorably. That is, in the preparation method according to an exemplary embodiment, the DFSR having fine unevenness on the surface may be formed by a more simplified method only using the transparent carrier film having the surface in which the fine unevenness is formed, without adding separate processes such as a plasma treatment process, and the like, or without changing the composition for forming the DFSR.

Therefore, according to an exemplary embodiment, problems of existing technology such as complication of the processes, deterioration of physical properties caused by composition change, and the like, may be solved, and the DFSR having the fine unevenness on the surface may be significantly simply prepared, and by applying the DFSR to a semiconductor package substrate, and the like, excellent adhesion with materials for subsequent processes may be secured, or releasing property with an epoxy molding compound (EMC) mold, and the like, may be secured in performing the processes, thereby assuring easiness of the processes.

Meanwhile, hereinafter, the photo-curable and heat-curable resin composition applied to the preparation method according to the exemplary embodiment will be more specifically described in each component, and then, the preparation method for DFSR using the same will be described.

Acid-Modified Oligomer

In the preparation method for DFSR according to the exemplary embodiment, the photo-curable and heat-curable resin composition is basically used. The resin composition includes an acid-modified oligomer having a carboxyl group (—COOH) and a photo-curable unsaturated functional group as one of major components. The acid-modified oligomer forms a cross-link bond with other components of the resin composition, that is, the photopolymerizable monomer and/or the heat-curable binder by photocuring, to allow the DFSR to be formed, and includes a carboxyl group to allow the resin composition to exhibit alkaline development property.

The acid-modified oligomer is an oligomer having a carboxyl group and a curable functional group, for example, an acrylate group or a photo-curable functional group having an unsaturated double bond in a molecule, and all components known to be usable in the photo-curable resin composition in the art may be used without specific limitation as the acid-modified oligomer. For example, the main chain of the acid-modified oligomer may be novolac epoxy or polyurethane, and the acid-modified oligomer having the main chain into which the carboxyl group and the acrylate group, and the like, are introduced may be used. The photo-curable functional group may be appropriately the acrylate group, wherein the acid-modified oligomer may include an oligomeric copolymer in which the polymerizable monomer having the carboxyl group is copolymerized with the monomer including the acrylate-based compound, and the like.

More specifically, specific examples of the acid-modified oligomer usable in the resin composition may include the following components:

(1) a carboxyl group-containing resin obtained by copolymerization of (a) an unsaturated carboxylic acid such as (meta)acrylic acid, or the like, and (b) a compound having an unsaturated double bond such as styrene, α-methyl styrene, lower alkyl(meth)acrylate, isobutylene, or the like;

(2) a carboxyl group-containing photosensitive resin obtained by reacting a portion of the copolymer of (a) the unsaturated carboxylic acid and (b) the compound (for example, glycidyl(meth)acrylate) having the unsaturated double bond with a compound having an ethylenically unsaturated group such as a vinyl group, an allyl group, a (meth)acryloyl group, or the like, and a reactive group such as an epoxy group, acid chloride, or the like, and then adding the ethylenically unsaturated group as a pendant;

(3) a carboxyl group-containing photosensitive resin obtained by reacting a copolymer of (c) a compound having an epoxy group such as glycidyl(meth)acrylate, α-methylglycidyl(meth)acrylate, or the like and an unsaturated double bond, and (b) the compound having the unsaturated double bond with (a) the unsaturated carboxylic acid, and reacting the prepared secondary hydroxy group with (d) saturated or unsaturated polybasic acid anhydride such as phthalic anhydride, tetrahydro phthalic anhydride, hexahydro phthalic anhydride, or the like;

(4) a carboxyl group-containing photosensitive resin obtained by reacting the copolymer of (e) acid anhydride having an unsaturated double bond such as maleic anhydride, itaconic anhydride, or the like, and (b) the compound having the unsaturated double bond with (f) a compound having one hydroxy group such as hydroxyalkyl(meth)acrylate, or the like, and having at least one ethylenically unsaturated double bond;

(5) a carboxyl group-containing photosensitive compound obtained by esterification (complete esterification or partial esterification, preferably, complete esterification) of (g) a polyfunctional epoxy compound having two or more epoxy groups in a molecule to be described below or an epoxy group of a polyfunctional epoxy resin obtained by additional epoxidation of a hydroxy group of the polyfunctional epoxy compound with epichlorohydrin, with a carboxyl group of (h) an unsaturated monocarboxylic acid such as a (meth)acrylic acid, or the like, followed by additional reaction of the prepared hydroxy group with saturated or unsaturated polybasic acid anhydride (d);

(6) a carboxyl group-containing resin obtained by reacting the epoxy group of the copolymer of (b) the compound having the unsaturated double bond and glycidyl(meth)acrylate with (i) an organic acid having one carboxyl group in one molecule such as C2 to C17 alkyl carboxylic acid, aromatic group-containing alkylcarboxylic acid, or the like, but not having ethylenically unsaturated bond, followed by reaction of the prepared secondary hydroxy group with (d) the saturated or unsaturated polybasic acid anhydride;

(7) a carboxyl group-containing urethane resin obtained by polyaddition reaction of (j) diisocyanate such as aliphatic diisocyanate, branched aliphatic diisocyanate, alicyclic diisocyanate, aromatic diisocyanate, or the like, (k) a carboxyl group-containing dialcohol compound such as dimethylol propionic acid, dimethylol butanoic acid, or the like, and (m) a diol compound such as polycarbonate-based polyol, polyether-based polyol, polyester-based polyol, polyolefin-based polyol, acrylic polyol, bisphenol A-based alkylene oxide adduct diol, a compound having a phenolic hydroxyl group and an alcoholic hydroxyl group, or the like;

(8) a carboxyl group-containing photosensitive urethane resin obtained by polyaddition reaction of (j) diisocyanate, (n) (meth)acrylate of a di-functional epoxy resin such as bisphenol A type epoxy resin, hydrogenated bisphenol A type epoxy resin, brominated bisphenol A type epoxy resin, bisphenol F type epoxy resin, bisphenol S type epoxy resin, bixylenol epoxy resin, biphenol epoxy resin, or the like, or partially modified acid anhydride, (k) a carboxyl group-containing dialcohol compound, and (m) a diol compound;

(9) a carboxyl group-containing urethane resin obtained by adding (f) the compound having one hydroxy group such as hydroxyalkyl(meth)acrylate, or the like, and having at least one ethylenically unsaturated double bond in the resin synthesis described in (7) or (8) to introduce an unsaturated double bond at the end;

(10) a carboxyl group-containing urethane resin obtained by adding a compound (such as an equimolar reaction product of isophorone diisocyanate and pentaerythrytol triacrylate) having one isocyanate group and at least one (meth)acryloyl group in a molecule in the synthesis of the resin (7) or (8) and introducing a (meth)acryl group at the end of the resultant product;

(11) a carboxyl group-containing photosensitive resin obtained by reacting a polyfunctional oxetane compound having two or more oxetane rings in a molecule to be described below with (h) the unsaturated monocarboxylic acid to obtain a modified oxetane compound, and reacting the primary hydroxy group of the obtained modified oxetane compound with (d) the saturated or unsaturated polybasic acid anhydride;

(12) a carboxyl group-containing photosensitive resin obtained by introducing an unsaturated double bond into a reaction product of a bisepoxy compound and bisphenol, followed by reaction with (d) the saturated or unsaturated polybasic acid anhydride;

(13) a carboxyl group-containing photosensitive resin obtained by reacting a reaction product of a novolac phenol resin and an alkylene oxide (e.g., ethylene oxide, propylene oxide, butylene oxide, trimethylene oxide, tetrahydrofuran, tetrahydropyran, or the like) and/or a cyclic carbonate (e.g., ethylene carbonate, propylene carbonate, butylene carbonate, 2,3-carbonate, propylene methacrylate, or the like) with (h) an unsaturated monocarboxylic acid, and then reacting the resultant product with (d) the saturated or unsaturated polybasic acid anhydride.

Among the above-described components, when the isocyanate group-containing compound used for the resin synthesis is diisocyanate not including a benzene ring in (7) to (10), and when the polyfunctional and di-functional epoxy resin used for the resin synthesis is a compound in a linear structure having bisphenol A framework, bisphenol F framework, biphenyl framework or bixylenol framework or a hydrogenated compound thereof in (5) and (8), components preferably usable as the acid-modified oligomer in view of flexibility of the DFSR may be obtained. In addition, in another aspect, the modified products of the resins (7) to (10) that contain a urethane bond in main chain thereof are preferred in view of bendability.

Further, as the above-described acid-modified oligomer, commercially available components may be used. Specific examples of the components may include ZAR-2000, ZFR-1031, ZFR-1121, ZFR-1122 (Nippon Kayaku Co., Ltd.), and the like.

Meanwhile, the acid-modified oligomer may be included in approximately 15 to 75 wt %, or approximately 20 to 50 wt %, or approximately 25 to 45 wt %, based on the total weight of the photo-curable and heat-curable resin composition. When the acid-modified oligomer has extremely small content, development property of the resin composition may be deteriorated and strength of the DFSR may be deteriorated. On the contrary, when the acid-modified oligomer has extremely high content, the resin composition may be excessively developed and uniformity at the time of performing a coating process may be deteriorated.

In addition, the acid-modified oligomer may have an acid value of approximately 40 to 120 mgKOH/g, or approximately 50 to 110 mgKOH/g, or 60 to 90 mgKOH/g. When the acid value is excessively decreased, alkaline development property may be deteriorated. On the contrary, when the acid value is excessively increased, a photo-curable part, for example an exposure part may be dissolved by development solution, such that it is difficult to form normal pattern of the DFSR.

Photopolymerizable Monomer

Meanwhile, the photo-curable and heat-curable resin composition includes photopolymerizable monomer. The photopolymerizable monomer may be a compound having two or more photo-curable unsaturated functional groups such as polyfunctional vinyl groups, and the like, and may form a cross-link bond with the unsaturated functional group of the acid-modified oligomer to form a cross-link structure by photo-curing at the time of exposure. Accordingly, the resin composition of the exposure part corresponding to a portion in which the DFSR is formed may be not alkaline-developed but may remain on the substrate.

The photopolymerizable monomer may be in a liquid phase at room temperature, and therefore, may serve to control viscosity of the resin composition according to a coating method, or to more improve alkaline development property of a non-exposure part.

As the photopolymerizable monomer, a (meth)acrylate-based compound having two or more, or three or more, or three to six photo-curable unsaturated functional groups in a molecule may be used. As more specific examples, the photopolymerizable monomer may include one or more compounds selected from the group consisting of a hydroxy group-containing polyfunctional acrylate-based compound such as pentaerythritol triacrylate or dipentaerythritol pentaacrylate; a water-soluble polyfunctional acrylate-based compound such as polyethylene glycol diacrylate or polypropylene glycol diacrylate; a polyhydric polyfunctional polyester acrylate-based compound such as trimethylolpropane triacrylate, pentaerythritol tetraacrylate, or dipentaerythritol hexaacrylate; an acrylate-based compound of an ethylene oxide adduct and/or a propylene oxide adduct of a polyfunctional alcohol such as trimethylolpropane or hydrogenated bisphenol A, or a polyphenol such as bisphenol A or biphenol; a polyfunctional or monofunctional polyurethane acrylate-based compound which is an isocyanate modified product of the hydroxy group-containing polyfunctional acrylate-based compound; an epoxy acrylate-based compound which is a (meth)acrylic acid adduct of bisphenol A diglycidyl ether, hydrogenated bisphenol A diglycidyl ether, or a phenol novolac epoxy resin; a caprolactone-modified acrylate-based compound such as caprolactone-modified ditrimethylolpropane tetraacrylate, acrylate of c-caprolactone-modified dipentaerythritol or caprolactone-modified hydroxypivalic acid neopentyl glycol ester diacrylate, and a photosensitive (meth)acrylate-based compound such as a (meta)acrylate-based compound corresponding to the above-described acrylate-based compound, and these photopolymerizable monomers may be used alone or in combination of two or more thereof.

Among them, as the photopolymerizable monomer, a polyfunctional (meth)acrylate-based compound having two or more, or three or more, or three to six (meth)acryloyl groups in one molecule may be preferably used. In particular, pentaerythritol triacrylate, trimethylolpropane triacrylate, dipentaerythritol hexaacrylate, or caprolactone-modified ditrimethylolpropane tetraacrylate, may be preferably used. Examples of the commercially available photopolymerizable monomer may include DPEA-12 (Kayarad), and the like.

The above-described photopolymerizable monomer may be included in approximately 5 to 30 wt %, or approximately 7 to 20 wt %, or approximately 7 to 15 wt %, based on the total weight of the resin composition. When the photopolymerizable monomer has excessively small content, photo-curing may not be sufficiently performed, and when the photopolymerizable monomer has excessively high content, the DFSR may be insufficiently dried and physical properties thereof may be deteriorated.

Photoinitiator

Meanwhile, the photo-curable and heat-curable resin composition includes a photoinitiator. The photoinitiator serves to initiate radical photocuring in the exposure part of the resin composition.

Examples of the photoinitiator may include known materials, for example, a benzoin-based compound such as benzoin and alkylethers thereof including benzoin, benzoin methyl ether, or benzoin ethyl ether; an acetophenone-based compound such as acetophenone, 2,2-dimethoxy-2-phenyl acetophenone, 1,1-dichloro acetophenone, or 4-(1-t-butyldioxy-1-methylethyl)acetophenone; an anthraquinone-based compound such as 2-methyl anthraquinone, 2-amyl anthraquinone, 2-t-butyl-anthraquinone, or 1-chloro-anthraquinone; a thioxanthone compound such as 2,4-dimethyl thioxanthone, 2,4-diisopropyl thioxanthone, or 2-chloro thioxanthone; a ketal compound such as acetophenone dimethyl ketal, or benzyl dimethyl ketal; a benzophenone-based compound such as benzophenone, 4-(1-t-butyldioxy-1-methylethyl)benzophenone, or 3,3',4,4'-tetrakis)t-butyldioxycarbonyl)benzophenone.

In addition, an α-amino acetophenone compound such as 2-methyl-1-[4-(methylthio)phenyl]-2-morpholino propanone-1,2-benzyl-2-dimethylamino-1-(4-morpholinophenyl)-butane-1-one, 2-(dimethyyamino)-2-[(4-methylphenyl)methyl]-1-[4-(4-morpholinyl)phenyl]-1-butanone, or N,N-dimethylamino acetophenone (Irgacure® 907, Irgacure® 369, Irgacure® 379, and the like, commercially available from Ciba Specialty Chemicals, which is Ciba Japan Co., Ltd.); an acylphosphine oxide compound such as 2,4,6-trimethylbenzoyldiphenylphosphine oxide, bis(2,4,6-trimethylbenzoyl)-phenyl phosphine oxide, bis(2,6-dimethoxybenzoyl)-2,4,4-trimethyl-pentylphosphineoxide (Lucirin® TPO commercially available from BASF, Irgacure® 819 commercially available from Ciba Specialty Chemicals, and the like) may also be used as an appropriate photoinitiator.

In addition, an oxime ester compound may be included as an appropriate photoinitiator. Specific examples of the oxime ester compound may include 2-(acetyloxyiminomethyl)thioxanthene-9-one, (1,2-octanedione, 1-[4-(phenylthio)phenyl]-, 2-(O-benzoyl oxime)), (ethanone, 1-[9-ethyl-6-(2-methylbenzoyl)-9H-carbazole-3-yl]-, 1-(O-acetyl oxime)), and the like. As commercially available products thereof, GGI-325, Irgacure OXE01, Irgacure OXE02 from Ciba Specialty Chemicals, N-1919 from ADEKA Corp., Darocur TPO from Ciba Specialty Chemicals, and the like, may be included. In addition, appropriate photoinitiators such as a non-imidazole-based compound, a triazine-based compound, and the like, may be used.

The photoinitiator may be included in approximately 0.5 to 20 wt %, or approximately 1 to 10 wt %, or approximately 1 to 5 wt %, based on the total weight of the resin composition. When the photoinitiator has extremely small content, photocuring may not be completely performed. On the contrary, when the photoinitiator has extremely high content, resolution of the resin composition may be deteriorated and the DFSR may have insufficient reliability.

Heat-Curable Binder

The photo-curable and heat-curable resin composition also includes a heat-curable binder having one or more heat-curable functional groups selected from the group consisting of an epoxy group, an oxetanyl group, a cyclic ether group, and a cyclic thioether group. The heat-curable binder may form a cross-link bond with the acid-modified oligomer, and the like, by heat curing to assure heat resistance or mechanical physical properties of the DFSR.

The heat-curable binder may have a softening point of approximately 70 to 100, and therefore, may reduce unevenness at the time of lamination. When the softening point is decreased, tackiness of the DFSR may be increased, and when the softening point is increased, flowability may be deteriorated.

As the heat-curable binder, a resin having two or more cyclic ether groups and/or cyclic thioether groups (hereinafter, referred to as (thio) ether group) in a molecule may be used, and di-functional epoxy resin may be used. Other diisocyanate or di-functional block isocyanate thereof may also be used.

The heat-curable binder having two or more cyclic (thio) ether groups in a molecule may be a compound having two or more of any one kind or two kinds selected from a 3, 4, or 5-membered cyclic ether group or a cyclic thioether group in a molecule. In addition, the heat-curable binder may be a polyfunctional epoxy compound having at least two epoxy groups in a molecule, a polyfunctional oxetane compound having at least two oxetanyl groups in a molecule, or an episulfide resin having two or more thioether groups in a molecule, and the like.

Specific examples of the polyfunctional epoxy compound may include a bisphenol A type epoxy resin, a hydrogenated bisphenol A type epoxy resin, a brominated bisphenol A type epoxy resin, a bisphenol F type epoxy resin, a bisphenol S type epoxy resin, a novolac type epoxy resin, a phenol novolac epoxy resin, a cresol novolac epoxy resin, an N-glycidyl epoxy resin, a novolac epoxy resin of bisphenol A, a bixylenol epoxy resin, a biphenol epoxy resin, a chelate epoxy resin, a glyoxal epoxy resin, an amino group-containing epoxy resin, a rubber-modified epoxy resin, a dicyclopentadiene phenolic epoxy resin, a diglycidyl phthalate resin, a heterocyclic epoxy resin, a tetraglycidyl xylenoyl ethane resin, a silicone-modified epoxy resin and a ε-caprolactone-modified epoxy resin, and the like. Further, in order to provide flame retardant, a compound having a structure into which atoms such as phosphorus, and the like, are introduced may be used. These epoxy resins may improve properties such as adherence of a cured coating film, solder heat resistance, electroless plating resistance, and the like, by heat-curing.

Examples of the polyfunctional oxetane compound may include polyfunctional oxetanes such as bis[(3-methyl-3-oxetanylmethoxy)methyl]ether, bis[(3-ethyl-3-oxetanylmethoxy)methyl]ether, 1,4-bis[(3-methyl-3-oxetanylmethoxy)methyl]benzene, 1,4-bis[(3-ethyl-3-oxetanylmethoxy)methyl]benzene, (3-methyl-3-oxetanyl)methylacrylate, (3-ethyl-3-oxetanyl)methylacrylate, (3-methyl-3-oxetanyl)methylmethacrylate, (3-ethyl-3-oxetanyl)methylmethacrylate, oligomers or copolymers thereof, and may include etherified products of oxetane alcohol with a hydroxy group-containing resin such as a novolac resin, poly(p-hydroxy styrene), cardo type bisphenols, calixarenes, calixresorcinarenes, silsesquioxane, and the like, in addition thereto. In addition, copolymers of an unsaturated monomer having an oxetane ring with alkyl (meth)acrylate may be included.

Examples of the above-described compound having two or more cyclic thioether groups in a molecule may include a bisphenol A type episulfide resin, YL7000, manufactured by the Japan Epoxy Resin Co., Ltd. In addition, an episulfide resin containing a sulfur atom in place of an oxygen atom of an epoxy group of the novolac type epoxy resin may also be used.

Further, another one that is commercially available is YCDN-500-80P® manufactured by Kukdo Chemical Co., Ltd.

The heat-curable binder may be included in a content corresponding to 0.8 to 2.0 equivalents based on 1 equivalent of the carboxyl group of the acid-modified oligomer. When the heat-curable binder has extremely small content, the carboxyl group remains in the DFSR after being cured, such that heat resistance, alkaline resistance, electric insulation, and the like, may be deteriorated. On the contrary, when the heat-curable binder has extremely high content, low molecular weight and heat-curable binder remains on the dried coating film, which deteriorates strength of the coating film, and therefore, it is not preferable.

In addition to each component as described above, the photo-curable and the heat-curable resin composition may further include a solvent; and one or more selected from the group consisting of heat-curable binder catalyst (heat-curable catalyst), filler, pigment, and additive to be described below.

Heat-Curable Binder Catalyst (Heat-Curable Catalyst)

The heat-curable binder catalyst serves to promote heat-curing of the heat-curable binder.

Examples of the heat-curable binder catalyst may include imidazole derivatives such as imidazole, 2-methyl imidazole, 2-ethyl imidazole, 2-ethyl-4-methyl imidazole, 2-phenyl imidazole, 4-phenyl imidazole, 1-cyanoethyl-2-phenyl imidazole, 1-(2-cyanoethyl)-2-ethyl-4-methyl imidazole, and the like; amine compounds such as dicyandiamide, benzyldimethyl amine, 4-(dimethylamino)-N,N-dimethylbenzyl amine, 4-methoxy-N,N-dimethylbenzyl amine, 4-methyl-N,N-dimethylbenzyl amine, and the like; hydrazine compounds such as adipic dihydrazide, sebacic dihydrazide, and the like; or phosphor compounds such as triphenylphosphine, and the like. In addition, examples of commercially available heat-curable binder catalyst may include imidazole-based products all manufactured by Shikoku Kasei Kogyo Co., Ltd., such as 2MZ-A®, 2MZ-OK®, 2PHZ®, 2P4BHZ®, or 2P4 MHZ®; block isocyanate compounds of dimethylamine all manufactured by San-Apro Ltd., such as U-CAT3503N® or UCAT3502T®; or bicyclic amidine compounds and salts thereof all manufactured by San-Apro Ltd., such as DBU®, DBN®, U-CATSA102®, or U-CAT5002®. The heat-curable binder catalyst is not specifically limited to the above-described examples and may include any heat-curable catalyst for epoxy resins or oxetane compounds, or any heat-curable catalyst for promoting the reaction of an epoxy group and/or an oxetanyl group and a carboxyl group, and may be used alone or as a mixture containing two or more thereof. In addition, as the heat-curable binder catalyst, S-triazine derivatives such as guanamine, acetoguanamine, benzoguanamine, melamine, 2,4-diamino-6-methacryloyloxyethyl-S-triazine, 2-vinyl-4,6-diamino-S-triazine, adducts of 2-vinyl-4,6-diamino-S-triazine and isocyanuric acid, or adducts of 2,4-diamino-6-methacryloyloxyethyl-S-triazine and isocyanuric acid. Preferably, those compounds which also function as an agent for providing adherence may be used in combination with the heat-curable binder catalyst.

The heat-curable binder catalyst may be included in approximately 0.3 to 15 wt % based on the total weight of the resin composition in a view of providing adequate heat curability.

Filler

A filler serves to improve heat-resistant stability, dimensional stability to heat, and resin adhesion. In addition, the filler acts as a body pigment by reinforcing the color.

As the filler, inorganic or organic fillers such as barium sulfate, barium titanate, amorphous silica, crystalline silica, fused silica, spherical silica, talc, clay, magnesium carbonate, calcium carbonate, aluminum oxide (alumina), aluminum hydroxide, mica, and the like, may be used.

The filler may be preferably included in approximately 5 to 50 wt % based on the total weight of the resin composition. When the filler is used more than 50 wt %, coatability may be deteriorated or a curing degree falls down due to increased viscosity of the composition, which is not preferable.

Pigment

A pigment serves to hide defects such as scratches of circuit lines by exhibiting visibility and hiding power.

As the pigment, red, blue, green, yellow, and black pigments may be used. As the blue pigment, phthalocyanine blue, pigment blue 15:1, pigment blue 15:2, pigment blue 15:3, pigment blue 15:4, pigment blue 15:6, pigment blue 60, and the like may be used. As the green pigment, pigment green 7, pigment green 36, solvent green 3, solvent green 5, solvent green 20, solvent green 28, and the like may be used. As the yellow pigment, an anthraquinone-based compound, an isoindolinone-based compound, a condensed azo-based compound, a benzimidazolone-based compound, and the like may be used, for example, pigment yellow 108, pigment yellow 147, pigment yellow 151, pigment yellow 166, pigment yellow 181, pigment yellow 193, and the like may be used.

The pigment may be preferably included in approximately 0.5 to 3 wt % based on the total weight of the resin composition. When the pigment is used less than 0.5 wt %, visibility and hiding power may be deteriorated, and when the pigment is used more than 3 wt %, heat resistance may be deteriorated.

Additive

An additive may be added to remove blister of the resin composition or remove popping or crater of the surface at the time of film coating, to provide flame retardant, to control viscosity, and to act as a catalyst.

Specifically, generally known additives including generally known viscosity agents such as silica powder, organic bentonite, montmorillonite, and the like; anti-foaming agents and/or leveling agents such as silicone-based, fluorine-based, high-molecular agents; silane coupling agents such as imidazole-based, thiazole-based, triazole-based agents; flame retardants such as phosphorus flame retardants, antimony-based flame retardants may be mixed with each other.

Among them, the leveling agent serves to remove popping or craters at the time of film coating. For example, BYK-380N, BYK-307, BYK-378, BYK-350, and the like from BYK-Chemie GmbH may be used.

The additive may be preferably included in approximately 0.01 to 10 wt % based on the total weight of the resin composition.

Solvent

One or more solvents may be mixed with each other in order to dissolve the resin composition or provide appropriate viscosity.

As the solvent, ketones such as methylethylketone, cyclohexanone, and the like; aromatic hydrocarbons such as toluene, xylene, tetramethylbenzene, and the like; glycol ethers (cellosolves) such as ethyleneglycol monoethylether, ethyleneglycol monomethylether, ethyleneglycol monobutylether, diethyleneglycol monoethylether, diethyleneglycol monomethylether, diethyleneglycol monobutylether, propyleneglycol monomethylether, propyleneglycol monoethylether, dipropyleneglycol diethylether, triethyleneglycol monoethylether, and the like; acetic acid esters such as ethyl acetate, butyl acetate, ethyleneglycol monoethylether acetate, ethyleneglycol monobutylether acetate, diethyleneglycol monoethylether acetate, diethyleneglycol monobutylether acetate, propyleneglycol monomethylether acetate, dipropyleneglycol monomethylether acetate, and the like; alcohols such as ethanol, propanol, ethylene glycol, propylene glycol, carbitol, and the like; aliphatic hydrocarbons such as octane, decane, and the like; petroleum solvents such as petroleum ether, petroleum naphtha, hydrogenated petroleum naphtha, solvent naphtha, and the like; and amides such as dimethyl acetamide, dimethylform amide (DMF), and the like may be used. These solvents may be used alone or as a mixture containing two or more thereof.

The solvent may be included in approximately 10 to 50 wt % based on the total weight of the resin composition. When the solvent has a content less than 10 wt %, viscosity may be high, such that coatability may be deteriorated, and when the solvent has a content more than 50 wt %, the composition may not be well dried, such that tackiness of the DFSR may be increased.

Meanwhile, in the preparation method according to an exemplary embodiment, the DFSR having the fine unevenness formed on the surface is formed by using the photo-curable and heat-curable resin composition. Hereinafter, a process of forming the DFSR will be described in each step with reference to the accompanying drawings. FIGS. 1a to 1e are process flow chart schematically showing a process of forming the DFSR having fine unevenness by a preparation method according to an exemplary embodiment of the present invention.

First, referring to FIG. 1a, in the preparation method according to an exemplary embodiment, the photo-curable and heat-curable resin composition 110 including each of the above-described components is formed on the transparent carrier film 100 having the surface in which a fine unevenness having an average roughness (Ra) of approximately 50 nm to 5 μm, or approximately 200 nm to 2 μm, or approximately 250 nm to 1 μm, or approximately 300 nm to 500 nm is formed. As the resin composition 110 is formed on the transparent carrier film 100 in which the fine unevenness is formed, the fine unevenness on the transparent carrier film 100 is reflected on the resin composition 110 and the DFSR formed from the resin composition, thereby finally preparing the DFSR having the fine unevenness.

Here, the transparent carrier film 100 needs to exhibit excellent transparency and light transmittance, and low haze so as to perform an exposure process by irradiating ultraviolet ray, and the like, to the resin composition 110 in subsequent processes. To this end, the transparent carrier film may have a light transmittance of approximately 90% or more, or approximately 92 to 100%, and a haze of approximately 5% or less, or approximately 1 to 4%. Meanwhile, the transparent carrier film 100 is not limited in view of light transmittance and haze, and in some cases, transparent carrier films 100 such as a matt PET, and the like, exhibiting relatively low light transmittance of approximately 65% or more, for example, approximately 65 to 80% may be used.

In addition, the transparent carrier film 100 may have the fine unevenness formed on the surface, wherein in order to form the fine unevenness, inorganic filler may be injected into a predetermined transparent plastic film, and the transparent plastic film having the fine unevenness obtained by the injection of the inorganic filler may be laminated with other even transparent plastic films, and the transparent carrier film 100 may be controlled to have an appropriate thickness. As the transparent carrier film 100, the transparent plastic film having fine unevenness directly formed by the above-described method may be used, or commercially available transparent plastic film having fine unevenness may be purchased and used.

On the transparent carrier film 100, the fine unevenness having an average roughness (Ra) of approximately 50 nm to 5 μm, or approximately 200 nm to 2 μm, or approximately 250 nm to 1 μm, or approximately 300 nm to 500 nm may be formed so that the DFSR having the fine unevenness in an appropriate size is favorably formed. If the average roughness (Ra) of the fine unevenness is extremely small, the fine unevenness in an appropriate size having desired performance may not be formed on the surface of the DFSR. On the contrary, if the average roughness (Ra) of the fine unevenness is extremely large, light scattering during the exposure process may excessively occur due to the fine unevenness on the transparent carrier film 100, and therefore, excellent DFSR may not be formed. Further, there is difficulty in securing haze of the DFSR film itself, and at the time of adhering with materials for subsequent processes in the manufacturing process of a semiconductor device, and the like, gaps may be formed, and therefore, problems may occur.

In addition, the transparent carrier film 100 may be easily removed from the photo-cured resin composition 110 after appropriately performing the subsequent exposure process, and may have a thickness of approximately 5 to 30 μm, or approximately 12 to 25 μm so that the fine unevenness in the above-described size is appropriately formed and maintained on the surface.

In addition, as the transparent carrier film 100, plastic films satisfying the physical properties such as transparency, size of the fine unevenness and thickness, may be used. For example, a polyester-based film or a polyolefin-based film may be used. More specific examples thereof may include polyester-based films such as a PET film including a matt polyethylene terephthalate (PET) film, or polyolefin-based films such as a polypropylene film, and the like.

Meanwhile, in order to form the photo-curable and heat-curable resin composition 110 on the transparent carrier film 100, the resin composition 110 as photosensitive coating material may be applied on the transparent carrier film 100 by a comma coater, a blade coater, a dip coater, a rod coater, a squeeze coater, a reverse coater, a transfer roll coater, a Gravure coater, or a spray coater.

After the resin composition 110 is applied on the transparent carrier film 100 as described above, the resin composition 110 on the transparent carrier film 100 may be dried. For drying, the transparent carrier film 100 having the resin composition 110 formed thereon may pass through an oven at approximately 50 to 130, or approximately 60 to 120, or approximately 70 to 110, for approximately 1 to 30 minutes, or approximately 3 to 20 minutes, or approximately 5 to 15 minutes. Through the drying process, the resin composition 110 on the transparent carrier film 100 may be in a semi-dried state having an increased viscosity in some degree. The increased viscosity of the resin composition 110 in a semi-dried state may be expressed by gelation time thereof. For example, the resin composition 110 in a semi-dried state may have gelation time of approximately 2 to 5 minutes or approximately 2½ to 4½ minutes under condition of 0.4 g and 160. Here, the gelation time may be measured by a gel time tester such as DH-15 manufactured by Daeheung Science, or the like, wherein the gelation time may be measured by putting approximately 0.5 g of the resin composition 110 into the tester in which a measurement temperature is set as 160, slowly stirring the composition with nonconductors such as wooden stick, and the like, and observing it in naked eyes. An average value deduced by repeating the measurement process three times to measure the gelation time may be a measured value of the gelation time.

After the resin composition 110 is dried to be in a semi-dried state, a release film, and the like, to be described below may be attached to the resin composition and transferred to perform subsequent processes of forming the DFSR (a process of forming the resin composition on the substrate, an exposure process, a development process, and the like), and the release film, and the like, may be removed immediately before the process of forming the DFSR and the subsequent processes may be performed. If the resin composition after the drying process has extremely low viscosity, and the like, it is not appropriate to transfer the composition for the subsequent processes. On the contrary, if the resin composition after the drying process has extremely high viscosity, and the like, it is not appropriate to perform the subsequent processes.

Meanwhile, after the drying process, the release film may be formed on the resin composition 110. The release film, which is to protect the resin composition 110 and maintain physical properties thereof when transfer or storage is required between the process of forming the resin composition 110 on the transparent carrier substrate 100 and the subsequent processes of forming the DFSR (the process of forming the resin composition on the substrate, the exposure process, the development process, and the like), may be delaminated immediately before the subsequent processes.

Examples of the release film may include a polyethylene (PE) film, a polytetrafluoroethylene film, a polypropylene film, a polyethylene terephthalate (PET) film, a surface-treated paper, and the like, and it is preferred that when delaminating the release film, adhesion between the resin composition 110 and the release film is lower than adhesion between the resin composition 110 and the transparent carrier film 100.

As described above, when the transfer or the storage is required between the process of forming the resin composition 110 on the transparent carrier substrate 100 and the subsequent processes of forming the DFSR, a film laminate after the resin composition 110 is formed on the transparent carrier film 100 and is dried may be provided as an intermediate for preparing the DFSR. The film laminate may include a transparent carrier film having a surface on which a fine unevenness having an average roughness (Ra) of approximately 50 nm to 5 μm is formed, and a layer of the photo-curable and heat-curable resin composition formed on the film, that is, a resin composition layer including (a) an acid-modified oligomer having a carboxyl group (—COOH) and a photo-curable unsaturated functional group, (b) a photopolymerizable monomer having two or more photo-curable unsaturated functional groups, (c) a heat-curable binder having a heat-curable functional group, and (d) a photoinitiator; wherein the resin composition layer may have a gelation time of approximately 2 to 5 minutes under condition of 0.4 g and 160. In addition, the film laminate may further include the release film formed on the resin composition layer as described above.

Meanwhile, as described above, after the photo-curable and heat-curable resin composition 110 is formed on the transparent carrier film 100 having the fine unevenness, as shown in FIG. 1b, the resin composition 110 may be laminated on the substrate 120 in which a circuit is formed, such as the package substrate of the semiconductor device, thereby forming a laminated structure in which the substrate 120, the resin composition 110, and the transparent carrier film 100 are sequentially formed. The above-described release film may be delaminated from the resin composition 110 immediately before the process of forming the laminated structure. In the forming of the laminated structure, the transparent carrier film 100 on which the resin composition 110 is formed may be adhered on the substrate 120 by a vacuum laminator, a hot roll laminator, vacuum press, or the like, so that the resin composition 110 is formed on the substrate 120.

Then, as shown in FIG. 1c, the exposure process may be performed on the resin composition 110 through the transparent carrier film 100 and the transparent carrier film 100 may be delaminated. Here, the exposure process may be performed by irradiating light such as ultraviolet ray, or the like, having a certain wavelength, and selective exposure may be performed through photo mask, or direct pattern exposure may be performed by laser direct exposure. Since the exposure process is performed through the transparent carrier film 100 having a surface in which the fine unevenness is formed, light scattering occurs by the fine unevenness during the exposure, which is not easy to perform the selective exposure. Considering this, the exposure process may be performed with increased exposure amount as compared to the existing known exposure process for forming the DFSR. Meanwhile, the exposure amount may be obviously determined in consideration of thickness to be exposed, for example, thickness of the transparent carrier film 100 and the resin composition 110, roughness of the fine unevenness on the transparent carrier film 110, and the like, by a person skilled in the art. The exposure process may be performed by irradiating ultraviolet ray with the exposure amount determined as described above. To this end, the exposure process may be appropriately performed while reducing an effect caused by light scattering, the DFSR in which the fine unevenness is formed may be favorably formed.

When the exposure process is performed, for example, the unsaturated functional group included in the acid-modified oligomer of the resin composition 110 and the unsaturated functional group included in the photopolymerizable monomer generate photo-curing to form the cross-link bond in the exposure part, and as a result, a cross-link structure by the photo-curing may be formed in the exposure part. Therefore, the resin composition 110 of the exposure part may not be removed by the subsequent alkaline development process, and may be photo-cured in a state in which the fine unevenness is reflected on the surface of the transparent carrier substrate 100, such that the cross-linked resin composition 110 of the exposure part may be formed in a shape in which the fine unevenness is formed on the surface contacting the transparent carrier substrate 100. Meanwhile, in the resin composition 110 of the non-exposure part, the carboxyl group of the acid-modified oligomer is maintained as it is, such that the alkaline development process may be performed.

After the exposure process is performed, the transparent carrier film 100 may be delaminated. When the transparent carrier film 100 is delaminated before the exposure, the delamination is not easily performed due to adhesion with the resin composition 110, and the like, and it is difficult to perform the subsequent processes, and therefore, the transparent carrier film 100 may be delaminated after the exposure in consideration of these difficulties.

Meanwhile, after the exposure process and the delamination process of the transparent carrier film are performed, as shown in FIG. 1d, the resin composition 110 of the non-exposure part is developed by using an alkaline solution, and the like. As the alkaline solution for performing the development process, alkaline aqueous solution such as potassium hydroxide, sodium hydroxide, sodium carbonate, potassium carbonate, sodium phosphate, sodium silicate, ammonia, or amines, or the like, may be used. Due to the development, the acid-modified oligomer and the photopolymerizable monomer, and the like, of the non-exposure part, may be dissolved in the development solution and removed. As a result, the resin composition 110 remains only on the desired portion of the substrate corresponding to the exposure part to thereby form the DFSR, and as described above, the DFSR (resin composition; 110) of the exposure part may have the fine unevenness formed on the surface due to the fine unevenness reflected on the surface of the transparent carrier film 100, and therefore, the DFSR having the fine unevenness may be more easily prepared without changing processes such as a plasma treatment process, and the like, or without changing the composition.

After the above-described development process is performed, as shown in FIG. 1e, the DFSR may be finally formed by heating and curing (post cure) the resin composition 110 on the substrate 120. It is appropriate for the heating and curing temperature to be approximately 100 or more. Due to the heating and curing, the heat-curable functional group of the heat-curable binder included in the resin composition 110 and the carboxyl group of the acid-modified oligomer are cross-linked to form the cross-linked structure. In addition, as a result obtained after the heating and curing is performed, the DFSR having the surface on which the fine unevenness having an average roughness (Ra) of approximately 50 nm to 5 μm, or approximately 200 nm to 2 μm, or approximately 250 nm to 1 μm, or approximately 300 nm to 500 nm is formed may be finally formed.

According to the above-described method, and the like, the DFSR and a printed circuit board including the same, for example, the package substrate of the semiconductor device may be provided, and the DFSR has the surface on which the predetermined fine unevenness is formed, and therefore, contact surface area with materials for the subsequent processes is increased, thereby exhibiting excellent adhesion. In addition, the DFSR may include a curing product of the above-described acid-modified oligomer; photopolymerizable monomer; and heat-curable binder having a heat-curable functional group by performing the photo-curing and heat-curing.

More specifically, in the curing product, the carboxyl group of the acid-modified oligomer may be cross-linked with the heat-curable functional group of the heat-curable reactor by the heat-curing, and the photo-curable unsaturated functional group of the acid-modified oligomer may be cross-linked with the unsaturated functional group included in the photopolymerizable monomer by photo-curing, thereby forming the cross-linked structure. In addition, as described above, the fine unevenness may be formed on the surface of the DFSR.

As such, the DFSR having the fine unevenness formed on the surface may be formed by easier and more simplified method without adding or changing processes such as a plasma treatment process, and the like, or without changing the composition, and therefore, when being applied to the semiconductor package substrate, and the like, the DFSR exhibiting excellent adhesion with materials for the subsequent processes may be provided, and the change or deterioration of physical properties of the DFSR caused by the change of the process or the composition, and the like, may be suppressed, thereby providing the DFSR exhibiting and maintaining excellent physical properties.

In addition, the DFSR may further include the photoinitiator in a small amount remaining after the photo-curing is performed, in a state in which the photoinitiator is dispersed in the curing product.

Advantageous Effects of Invention

According to the present invention, a dry film solder resist (DFSR) having fine unevenness on a surface may be formed by a more simplified method only using a transparent carrier film having a surface on which the fine unevenness is formed, without adding or changing processes such as a plasma treatment process, and the like, or without changing a composition.

When the DFSR formed thereby is applied on a semiconductor package substrate, and the like, excellent adhesion with materials for subsequent processes may be exhibited and excellent releasing property with an epoxy molding compound (EMC) mold may be secured by the fine uneveness, thereby assuring easiness of the processes.

BRIEF DESCRIPTION OF DRAWINGS

FIGS. 1a to 1e are process flow charts schematically showing a process of forming a dry film solder resist (DFSR) having fine unevenness by a preparation method according to an exemplary embodiment of the present invention.

FIGS. 2 and 3 are FE-SEM images showing surface states of the DFSRs formed by Examples 1 and 2.

FIGS. 4a and 4b are a 2D image and a 3D image obtained by optical profiler in order to calculate surface roughness of the DFSR formed by Comparative Example 1.

FIGS. 5a and 5b are a 2D image and a 3D image obtained by optical profiler in order to calculate surface roughness of the DFSR formed by Example

DESCRIPTION OF EMBODIMENTS

Hereinafter, action and effects of the present invention will be described in more detail with reference to specific examples of the present invention. Meanwhile, these examples are illustrative only and the scope of the invention is not limited thereto.

EXAMPLE

Example 1

(1) Preparation of Photo-Curable and Heat-Curable Resin Composition

A photo-curable and heat-curable resin composition was prepared by mixing 41.5 wt % ZFR-1122 (Nippon Kayaku Co., Ltd.) as an acid-modified oligomer, 10 wt % of a polyfunctional epoxy acrylate (DPEA-12 from Nippon Kayaku Co., Ltd.) as a photopolymerizable monomer, 3 wt % of Darocur TPO (Ciba Specialty Chemicals Inc.) as a photoinitiator, 16 wt % of YDCN-500-80P (Kukdo Chemical Co., Ltd.) as a heat-curable binder, 1 wt % of 2-phenylimidazole as a heat-curable catalyst, 15 wt % of B-30 (Sakai Chemical Co., Ltd.) as a filler, 0.5 wt % of BYK-333 (BYK Company) as an additive, and 13 wt % of DMF as a solvent with each other, followed by stirring, and dispersing the filler by a three-roll mill.

(2) Preparation of Dry Film Solder Resist (Using Transparent Carrier Film Having Fine Unevenness)

The prepared resin composition was applied on PET used as the transparent carrier film by a comma coater. Here, SD-15 (SKC company) was used as the transparent carrier film, wherein the fine unevenness having an average roughness of approximately 344.67 nm (Ra) and approximately 636 μm (Rz) is formed on the transparent carrier film, and a thickness is approximately 20 μm.

After the resin composition was applied on the transparent carrier film, the transparent carrier film was dried by passing through an oven at approximately 75, for 8 minutes, and PE as a release film was laminated thereon, thereby preparing a dry film consisting of the transparent carrier film having the fine unevenness, the photosensitive film, and the release film in sequence. In the dry film, gelation time of the photosensitive film after the drying process was measured under condition of 0.4 g and 160, and measurement method and measurement result thereof were summarized and shown in the following Test Example 4.

(3) Manufacture of Semiconductor Package Substrate

After the release film of the manufactured dry film was delaminated, a photosensitive film layer was vacuum-laminated by a vacuum laminator (MV LP-500 from Meiki Co., Ltd.) on the substrate in which a circuit is formed, then exposed by UV having a wavelength of 365 nm at 400 mJ/cm$^2$, and the PET film was removed. The resultant was immersed in a stirred alkaline solution of 1% $Na_2CO_3$ at 31 for 60 seconds to be developed, and heated and cured at 150 for 1 hour, thereby completing a printed circuit board including the dry film solder resist (DFSR).

Meanwhile, as the substrate in which the circuit is formed, a substrate having the fine unevenness formed on the surface of a copper foil was used by cutting a copper foil laminate in a thickness of 0.1 mm manufactured by LG Chem, wherein the copper foil has a thickness of 12 μm, into a 5 cm×5 cm substrate, followed by chemical etching.

Example 2

(1) Preparation of Dry Film Solder Resist

A photo-curable and heat-curable resin composition was prepared by mixing 41.5 wt % ZFR-1122 (Nippon Kayaku Co., Ltd.) as an acid-modified oligomer, 10 wt % of a polyfunctional epoxy acrylate (DPEA-12 from Nippon Kayaku Co., Ltd.) as a photopolymerizable monomer, 3 wt % of Darocur TPO (Ciba Specialty Chemicals Inc.) as a photoinitiator, 16 wt % of YDCN-500-80P (Kukdo Chemical Co., Ltd.) as a heat-curable binder, 1 wt % of 2-phenylimidazole as a heat-curable catalyst, 15 wt % of B-30 (Sakai Chemical Co., Ltd.) as a filler, 0.5 wt % of BYK-333 (BYK Company) as an additive, and 13 wt % of DMF as a solvent with each other, followed by stirring, and dispersing the filler by a three-roll mill.

(2) Preparation of Dry Film Solder Resist (Using Transparent Carrier Film Having Fine Unevenness)

The prepared resin composition was applied on PET used as the transparent carrier film by a comma coater. Here, a film (Toray company) was used as the transparent carrier film, wherein the fine unevenness having an average roughness of approximately 405 nm (Ra) and approximately 11.67 μm (Rz) is formed on the transparent carrier film, and a thickness is approximately 23 μm.

After the resin composition was applied on the transparent carrier film, the transparent carrier film was dried by passing through an oven at approximately 75, for 8 minutes, and PE as a release film was laminated thereon, thereby preparing a dry film consisting of the transparent carrier film having the fine unevenness, the photosensitive film, and the release film in sequence. In the dry film, gelation time of the photosensitive film after the drying process was measured under condition of 0.4 g and 160, and measurement method and measurement result thereof were summarized and shown in the following Test Example 4.

(3) Manufacture of Semiconductor Package Substrate

After the release film of the manufactured dry film was delaminated, a photosensitive film layer was vacuum-laminated by a vacuum laminator (MV LP-500 from Meiki Co., Ltd.) on the substrate in which a circuit is formed, then exposed by UV having a wavelength of 365 nm at 400 mJ/cm$^2$, and the PET film was removed. The resultant was immersed in a stirred alkaline solution of 1% $Na_2CO_3$ at 31 for 60 seconds to be developed, and heated and cured at 150 for 1 hour, thereby completing a printed circuit board including the dry film solder resist (DFSR).

Meanwhile, as the substrate in which the circuit is formed, a substrate having the fine unevenness formed on the surface of a copper foil was used by cutting a copper foil laminate in a thickness of 0.1 mm manufactured by LG Chem, wherein the copper foil has a thickness of 12 μm, into a 5 cm×5 cm substrate, followed by chemical etching.

Example 3

(1) Preparation of Dry Film Solder Resist

A photo-curable and heat-curable resin composition was prepared by mixing 41.5 wt % ZFR-1122 (Nippon Kayaku Co., Ltd.) as an acid-modified oligomer, 10 wt % of a polyfunctional epoxy acrylate (DPEA-12 from Nippon Kayaku Co., Ltd.) as a photopolymerizable monomer, 3 wt % of Darocur TPO (Ciba Specialty Chemicals Inc.) as a photoinitiator, 16 wt % of YDCN-500-80P (Kukdo Chemical Co., Ltd.) as a heat-curable binder, 1 wt % of 2-phenylimidazole as a heat-curable catalyst, 15 wt % of B-30 (Sakai Chemical Co., Ltd.) as a filler, 0.5 wt % of BYK-333 (BYK Company) as an additive, and 13 wt % of DMF as a solvent with each other, followed by stirring, and dispersing the filler by a three-roll mill.

(2) Preparation of Dry Film Solder Resist (Using Transparent Carrier Film Having Fine Unevenness)

The prepared resin composition was applied on PET used as the transparent carrier film by a comma coater. Here, a film (Toray company) was used as the transparent carrier film, wherein the fine unevenness having an average roughness of approximately 500 nm (Ra) and approximately 26.71 μm (Rz) is formed on the transparent carrier film, and a thickness is approximately 19 μm.

After the resin composition was applied on the transparent carrier film, the transparent carrier film was dried by passing through an oven at approximately 75, for 8 minutes, and PE as a release film was laminated thereon, thereby preparing a dry film consisting of the transparent carrier film having the fine unevenness, the photosensitive film, and the release film in sequence. In the dry film, gelation time of the photosensitive film after the drying process was measured under condition of 0.4 g and 160, and measurement method and measurement result thereof were summarized and shown in the following Test Example 4.

(3) Preparation of Semiconductor Package Substrate

After the release film of the manufactured dry film was delaminated, a photosensitive film layer was vacuum-laminated by a vacuum laminator (MV LP-500 from Meiki Co., Ltd.) on the substrate in which a circuit is formed, then exposed by UV having a wavelength of 365 nm at 400 mJ/cm², and the PET film was removed. The resultant was immersed in a stirred alkaline solution of 1% Na₂CO₃ at 31 for 60 seconds to be developed, and heated and cured at 150 for 1 hour, thereby completing a printed circuit board including the dry film solder resist (DFSR).

Meanwhile, as the substrate in which the circuit is formed, a substrate having the fine unevenness formed on the surface of a copper foil was used by cutting a copper foil laminate in a thickness of 0.1 mm manufactured by LG Chem, wherein the copper foil has a thickness of 12 μm, into a 5 cm×5 cm substrate, followed by chemical etching.

COMPARATIVE EXAMPLE

Comparative Example 1

(1) Preparation of Dry Film Solder Resist

A photo-curable and heat-curable resin composition was prepared by mixing 41.5 wt % ZFR-1122 (Nippon Kayaku Co., Ltd.) as an acid-modified oligomer, 10 wt % of a polyfunctional epoxy acrylate (DPEA-12 from Nippon Kayaku Co., Ltd.) as a photopolymerizable monomer, 3 wt % of Darocur TPO (Ciba Specialty Chemicals Inc.) as a photoinitiator, 16 wt % of YDCN-500-80P (Kukdo Chemical Co., Ltd.) as a heat-curable binder, 1 wt % of 2-phenylimidazole as a heat-curable catalyst, 15 wt % of B-30 (Sakai Chemical Co., Ltd.) as a filler, 0.5 wt % of BYK-333 (BYK Company) as an additive, and 13 wt % of DMF as a solvent with each other, followed by stirring, and dispersing the filler by a three-roll mill.

(2) Preparation of Dry Film Solder Resist (Using Transparent Carrier Film Having Fine Unevenness)

The prepared resin composition was applied on PET used as the transparent carrier film by a comma coater. Here, a G2 grade (Teijin-Dupont Company) was used as the transparent carrier film, wherein the fine unevenness having an average roughness of approximately 47.83 nm (Ra) and approximately 0.99 μm (Rz) is formed on the transparent carrier film, and a thickness is approximately 23 μm.

After the resin composition was applied on the transparent carrier film, the transparent carrier film was dried by passing through an oven at approximately 75, for 8 minutes, and PE as a release film was laminated thereon, thereby preparing a dry film consisting of the transparent carrier film having the fine unevenness, the photosensitive film, and the release film in sequence. In the dry film, gelation time of the photosensitive film after the drying process was measured under condition of 0.4 g and 160, and measurement method and measurement result thereof were summarized and shown in the following Test Example 4.

(3) Manufacture of Semiconductor Package Substrate

After the release film of the manufactured dry film was delaminated, a photosensitive film layer was vacuum-laminated by a vacuum laminator (MV LP-500 from Meiki Co., Ltd.) on the substrate in which a circuit is formed, then exposed by UV having a wavelength of 365 nm at 400 mJ/cm², and the PET film was removed. The resultant was immersed in a stirred alkaline solution of 1% Na₂CO₃ at 31 for 60 seconds to be developed, and heated and cured at 150 for 1 hour, thereby completing a printed circuit board including the dry film solder resist (DFSR).

Meanwhile, as the substrate in which the circuit is formed, a substrate having the fine unevenness formed on the surface of a copper foil was used by cutting a copper foil laminate in a thickness of 0.1 mm manufactured by LG Chem, wherein the copper foil has a thickness of 12 μm, into a 5 cm×5 cm substrate, followed by chemical etching.

Test Example

Evaluation on Physical Properties of Protective Film for Printed Circuit Board Surface roughness, development property, and heat resistance reliability of the DFSR for a printed circuit board manufactured by Examples 1 to 3 and Comparative Example 1 were evaluated by the following methods.

Experimental Example 1

Average Roughness (Ra)

After the release film of the DFSR obtained by Examples 1 to 3 and Comparative Example 1 was delaminated, and the DFSR was positioned on the copper foil laminate, vacuum-treated for 20 seconds, and laminated at 65 and 0.7Mpa for 40 seconds by a vacuum laminator.

Next, a quartz photomask made in a negative manner was positioned on the laminated DFSR, followed by exposure by UV(i band) at 400 mJ/cm², and the PET film used as the carrier film was removed, and the DFSR was developed by 1% Na₂CO₃ alkaline solution at 30 for 60 seconds, washed, and dried.

A surface state of the dried sample was observed by FE-SEM (Hitachi S-4800), and in order to accurately measure difference in average roughness between Example 1 and Comparative Example 1, average roughness values (Ra) were measured and compared with each other by optical profiler (OP). FE-SEM images of the surface state of Examples 1 and 2 were shown in FIGS. 2 and 3, respectively, and images on the surface state of Example 1 and Comparative Example 1 measured by OP were shown in FIG. 4a (2D-image of Comparative Example 1), FIG. 4b (3D-image of Comparative Example 1), FIG. 5a (2D-image of Example 1) and FIG. 5b (3D-image of Example 1), respectively. In addition, Ra values measured in Examples 1 and 2 were summarized in the following Tables 1 and 2.

TABLE 1

Measurement result of Ra of Comparative Example 1 in Experimental Example 1

|  |  | Comparative Example 1 |
|---|---|---|
| Roughness | Ra (nm) | 58.28 |
|  | Rz (μm) | 0.99 |

TABLE 2

Measurement result of Ra of Example 1 in Experimental Example 1

|  |  | Example 1 |
|---|---|---|
| Roughness | Ra (nm) | 264.51 |
|  | Rz (μm) | 3.08 |

Referring to Table 2, FIGS. 5a and 5b, it was confirmed that the DFSR of Example had the surface on which the fine unevenness having a predetermined level of average roughness (Ra) is formed. Accordingly, it was confirmed that the DFSR could be appropriately applied for improving adhesion with materials for subsequent processes.

Meanwhile, referring to Table 1, FIGS. 4a and 4b, it was confirmed that the DFSR of Comparative Example 1 had an average roughness (Ra) which is significantly smaller than that of Example 1, such that the DFSR of Comparative Example 1 could not properly have action and effect obtained by the formation of the fine unevenness.

Experimental Example 2

Evaluation on Development Property

After the release film of the DFSR obtained by Examples 1 to 3 and Comparative Example 1 was delaminated, and the DFSR was positioned on the copper foil laminate, vacuum-treated for 20 seconds, and laminated at 65 and 0.7 Mpa for 40 seconds by a vacuum laminator.

Next, a quartz photomask made in a negative manner was positioned on the laminated DFSR, followed by exposure by UV(i band) at 400 mJ/cm$^2$, and the PET film used as the carrier film was removed, and the DFSR was developed by 1% Na$_2$CO$_3$ alkaline solution at 30 for 60 seconds, washed, and dried.

Evaluation standard on development property and result thereof were summarized in the following Table 3.

Experimental Example 3

Measurement Method of Heat Resistance Reliability

A protective film for a printed circuit board was laminated on CCL, and photo-curing, heat-curing, and subsequent photo-curing processes were performed to complete the film, and the film was cut into a size of 150 mm*130 mm. A lead bath (an electric furnace which is electrically heated and temperature-controllable and contains at least 2.25 kg or more of lead for a test) was set to have a temperature of 288, and a test specimen was floated on the lead bath so that a surface thereof having a film is directed to an upward direction. The test specimen was examined whether or not film delamination or modification in view of appearance occurs.

Evaluation standard on heat resistance reliability and result thereof were summarized in the following Table 3.

TABLE 3

Measurement result of Experimental Examples 2 and 3

|  | Heat Resistance Reliability | Development Property |
|---|---|---|
| Example 1 | OK | OK |
| Example 2 | OK | OK |
| Example 3 | OK | OK |
| Comparative Example 1 | OK | OK |

1. Evaluation Standard on Heat Resistance Reliability
(1) OK: 288, not burst in solder floating
(2) NG: 288, burst in solder floating
2. Development Property
(1) OK: a case where a developed hole has a size of 80% or more based on a mask size by Fe-SEM observation
(2) NG: a case where the hole has a size less than 80% by Fe-SEM observation Referring to Table 3 above, it was confirmed that the DFSR of Example had the fine unevenness formed on the surface, and exhibited excellent heat resistance reliability and development property corresponding to those of Comparative Example in which the fine unevenness is rarely formed. Therefore, the DFSR of Example may exhibit excellent adhesion and excellent physical properties as the DFSR.

Experimental Example 4

Measurement Method of Gelation Time

After the drying process was performed in each of the above-described Examples, gelation time with respect to each resin composition was measured by the following method.

A gel time tester, DH-15 manufactured by Daeheung Science, was used for measuring the gelation time, and approximately 0.5 g of the resin composition was put into the tester in which a measurement temperature is set as 160, and slowly stirred with a wooden stick two times per a second. The composition was observed in naked eyes while stirring, and the gelation time was measured. An average value deduced by repeating the measurement process three times to measure the gelation time was determined as a measured value of the gelation time. Measurement result of the gelation time was summarized and shown in the following Table 4.

TABLE 4

Measurement result of gelation time (Unit: second)

|  | Measurement Result (once/two times/three times) | Average |
|---|---|---|
| Example 1 | 169/171/170 | 170 |
| Example 2 | 173/178/173 | 173.3 |
| Example 3 | 158/165/167 | 163.3 |

It was confirmed through the test results that the compositions of Examples 1 and 3 could have appropriate viscosity defined by the gelation time after the drying process, and as the subsequent processes are performed, the DFSR having the fine unevenness could be appropriately prepared.

The invention claimed is:

1. A preparation method for a dry film solder resist (DFSR), comprising:
    forming a photo-curable and heat-curable resin composition on a transparent carrier film having a surface on which a fine unevenness having an average roughness (Ra) of 200 nm to 2 μm is formed, the resin composition including (a) an acid-modified oligomer having a carboxyl group (—COOH) and a photo-curable unsaturated functional group, (b) a photopolymerizable monomer having two or more photo-curable unsaturated functional groups, (c) a heat-curable binder having a heat-curable functional group, and (d) a photoinitiator;
    laminating the resin composition on a substrate to form a laminated structure in which the substrate, the resin composition, and the transparent carrier film are sequentially formed;
    exposing the resin composition and delaminating the transparent carrier film; and
    alkaline-developing the resin composition in a non-exposure part and performing heat-curing to form the DFSR,
    wherein the transparent carrier film has a light transmittance of 90% or more, and wherein after the heat-curing, a surface on the DFSR is formed, which has a fine unevenness having an average roughness (Ra) of 200 nm to 2 μm.

2. The preparation method of claim 1, further comprising: drying the resin composition on the transparent carrier film before the forming of the laminated structure.

3. The preparation method of claim 2, further comprising: forming a release film on the resin composition between the drying and the forming of the laminated structure, wherein the release film is delaminated immediately before the forming of the laminated structure.

4. The preparation method of claim 1, wherein the transparent carrier film has a haze of 5% or less.

5. The preparation method of claim 1, wherein the transparent carrier film has a thickness of 5 to 30 μm.

6. The preparation method of claim 1, wherein the transparent carrier film includes a polyester film or a polyolefin film.

7. The preparation method of claim 3, wherein the release film is a polyethylene (PE) film, a polytetrafluoroethylene film, a polypropylene film, a polyethylene terephthalate (PET) film or a surface-treated paper.

8. The preparation method of claim 1, wherein the photocurable unsaturated functional group of the acid-modified oligomer (a) is an acrylate group.

9. The preparation method of claim 1, wherein the acid-modified oligomer (a) includes a copolymer of a polymerizable monomer having a carboxyl group and a monomer including an acrylate compound.

10. The preparation method of claim 1, wherein the resin composition includes the acid-modified oligomer (a) in 15 to 75 wt % based on the total weight of the resin composition.

11. The preparation method of claim 1, wherein the photopolymerizable monomer (b) includes a polyfunctional (meth)acrylate compound having two or more (meth)acryloyl groups in a molecule.

12. The preparation method of claim 1, wherein the resin composition includes the photopolymerizable monomer (b) in 5 to 30 wt % based on the total weight of the resin composition.

13. The preparation method of claim 1, wherein the resin composition includes the photoinitiator (d) in 0.5 to 20 wt % based on the total weight of the resin composition.

14. The preparation method of claim 1, wherein the heat-curable functional group of the heat-curable binder (c) is one or more selected from the group consisting of an epoxy group, an oxetanyl group, a cyclic ether group, and a cyclic thioether group.

15. The preparation method of claim 1, wherein the heat-curable binder is included in the resin composition in a content corresponding to 0.8 to 2.0 equivalent with respect to 1 equivalent of the carboxyl group of the acid-modified oligomer.

16. The preparation method of claim 1, wherein the resin composition further includes one or more selected from the group consisting of a solvent; a heat-curable binder catalyst, a filler, a pigment, and an additive.

* * * * *